(12) United States Patent
Takahashi et al.

(10) Patent No.: US 7,718,901 B2
(45) Date of Patent: May 18, 2010

(54) ELECTRONIC PARTS SUBSTRATE AND METHOD FOR MANUFACTURING THE SAME

(75) Inventors: Michimasa Takahashi, Ogaki (JP); Ian Timms, Camberley (GB)

(73) Assignees: Ibiden Co., Ltd., Ogaki-shi (JP); Nokia Corporation, Helsinki (FI)

( * ) Notice: Subject to any disclaimer, the term of this patent is extended or adjusted under 35 U.S.C. 154(b) by 232 days.

(21) Appl. No.: 11/923,509

(22) Filed: Oct. 24, 2007

(65) Prior Publication Data

US 2009/0107708 A1 Apr. 30, 2009

(51) Int. Cl.
*H05K 1/00* (2006.01)
*H05K 3/02* (2006.01)
(52) U.S. Cl. .................................. 174/254; 29/847
(58) Field of Classification Search .................. 174/254; 361/749–751; 29/847
See application file for complete search history.

(56) References Cited

U.S. PATENT DOCUMENTS 4,338,149 A * 7/1982 Quaschner .................. 156/248
5,045,642 A * 9/1991 Ohta et al. .................. 174/266
2005/0023703 A1* 2/2005 Sebesta et al. .............. 257/780
2007/0126971 A1* 6/2007 Lo .............................. 349/149

FOREIGN PATENT DOCUMENTS

JP 2005-354093 12/2005
JP 2006-148177 6/2006

* cited by examiner

*Primary Examiner*—Jeremy C Norris
(74) *Attorney, Agent, or Firm*—Ditthavong Mori & Steiner, P.C.

(57) ABSTRACT

An electronic parts substrate includes a base substrate, a plurality of insulating resin layers provided on the base substrate, at least one conductive circuit, and at least one filled via provided in the plurality of insulating resin layers. The at least one conductive circuit is sandwiched between the plurality of insulating resin layers and/or between the base substrate and the plurality of insulating resin layers. At least one opening is formed in at least one of the plurality of insulating resin layers.

2 Claims, 13 Drawing Sheets

ELECTRONIC PARTS SUBSTRATE AND METHOD FOR MANUFACTURING THE SAME

BACKGROUND OF THE INVENTION

1. Field of the Invention

The present invention relates to an electronic parts substrate and a method for manufacturing the electronic parts substrate.

2. Discussion of the Background

As means of suppressing the height of an electronic parts substrate having electronic parts mounted thereon, multilayered ceramic board in each of which cavities for housing various electronic parts are provided on its top surface and bottom surface are disclosed, for example, in Japanese Patent Application Laid-Open No. 2005-354093 and Japanese Patent Application Laid-Open No. 2006-148177. Japanese Patent Application Laid-Open Nos. 2005-354093 and 2006-148177 are incorporated herein by reference in their entirety.

However, the technique disclosed in the patent documents relates to a cavity-provided multilayered ceramic board with a low thermal expansion coefficient, and its reduction in reliability originated from heat contraction hardly becomes an issue as compared with a multilayered resin board. In a case where cavities are formed in an electronic parts substrate having a lamination of insulating resins, the thermal expansion coefficient of the insulating resin is high, making the thermal stress locally greater due to the influence of the cavities. This makes the insulating resin layers and conductive circuits susceptible to cracks, causing disconnection and lowering of the reliability.

SUMMARY OF THE INVENTION

According to one aspect of the present invention, an electronic parts substrate includes a base substrate, a plurality of insulating resin layers provided on the base substrate, at least one conductive circuit, and at least one filled via provided in the plurality of insulating resin layers. The at least one conductive circuit is sandwiched between the plurality of insulating resin layers and/or between the base substrate and the plurality of insulating resin layers. At least one opening is formed in at least one of the plurality of insulating resin layers.

According to another aspect of the present invention, an electronic device includes an electronic parts substrate which includes a base substrate, a plurality of insulating resin layers provided on the base substrate, at least one conductive circuit, and at least one filled via provided in the plurality of insulating resin layers. The at least one conductive circuit is sandwiched between the plurality of insulating resin layers and/or between the base substrate and the plurality of insulating resin layers. At least one opening is formed in at least one of the plurality of insulating resin layers.

According to further aspect of the present invention, a method for manufacturing an electronic parts substrate includes providing a base substrate having opposite upper and lower faces, providing an upper conductive circuit and an upper solder resist layer on the upper face of the base substrate, providing a lower conductive circuit and a lower solder resist layer on the lower face of the base substrate, providing a first upper resin layer on the upper conductive circuit and the upper solder resist layer, and providing a first lower resin layer on the lower conductive circuit and the lower solder resist layer. The first upper resin layer has a preformed opening. The first lower resin layer has a preformed opening. A first upper copper foil is provided on the first upper resin layer to adhere to an inner surface of the preformed opening of the first upper resin layer. A first lower copper foil is provided on the first lower resin layer to adhere to an inner surface of the preformed opening of the first lower resin layer. A second upper resin layer is provided on the first upper copper foil. A second lower resin layer is provided on the first lower copper foil. A second upper copper foil is provided on the second upper resin layer. A second lower copper foil is provided on the second lower resin layer. The second upper resin layer and the first upper copper foil are cut along a periphery of the preformed opening using a laser. The second lower resin layer and the first lower copper foil are cut along a periphery of the preformed opening using a laser. The cut second upper resin layer and the first upper copper foil are removed to form an upper opening in which the upper conductive circuit is exposed. The cut second lower resin layer and the first lower copper foil are removed to form a lower opening in which the lower conductive circuit is exposed. A first surface treatment is performed on the exposed upper conductive circuit. A second surface treatment is performed on the exposed lower conductive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
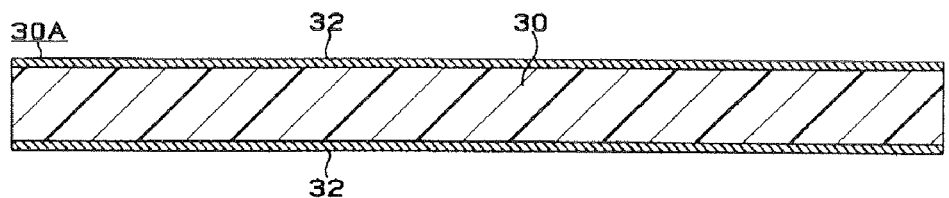
FIGS. 1A to 1C are explanatory diagrams for a fabrication process for an electronic parts substrate according to a first embodiment of the present invention.
Figure 1B:
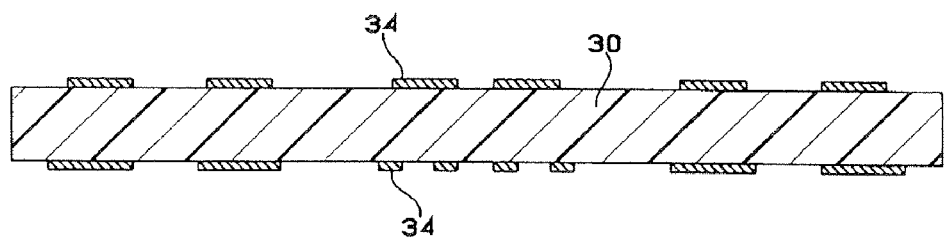
Figure 1C:
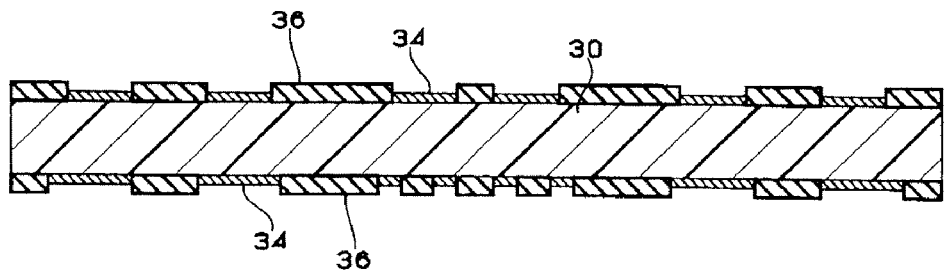

The embodiments will now be described with reference to the accompanying drawings, wherein like reference numerals designate corresponding or identical elements throughout the various drawings.

First Embodiment

Figure 7:
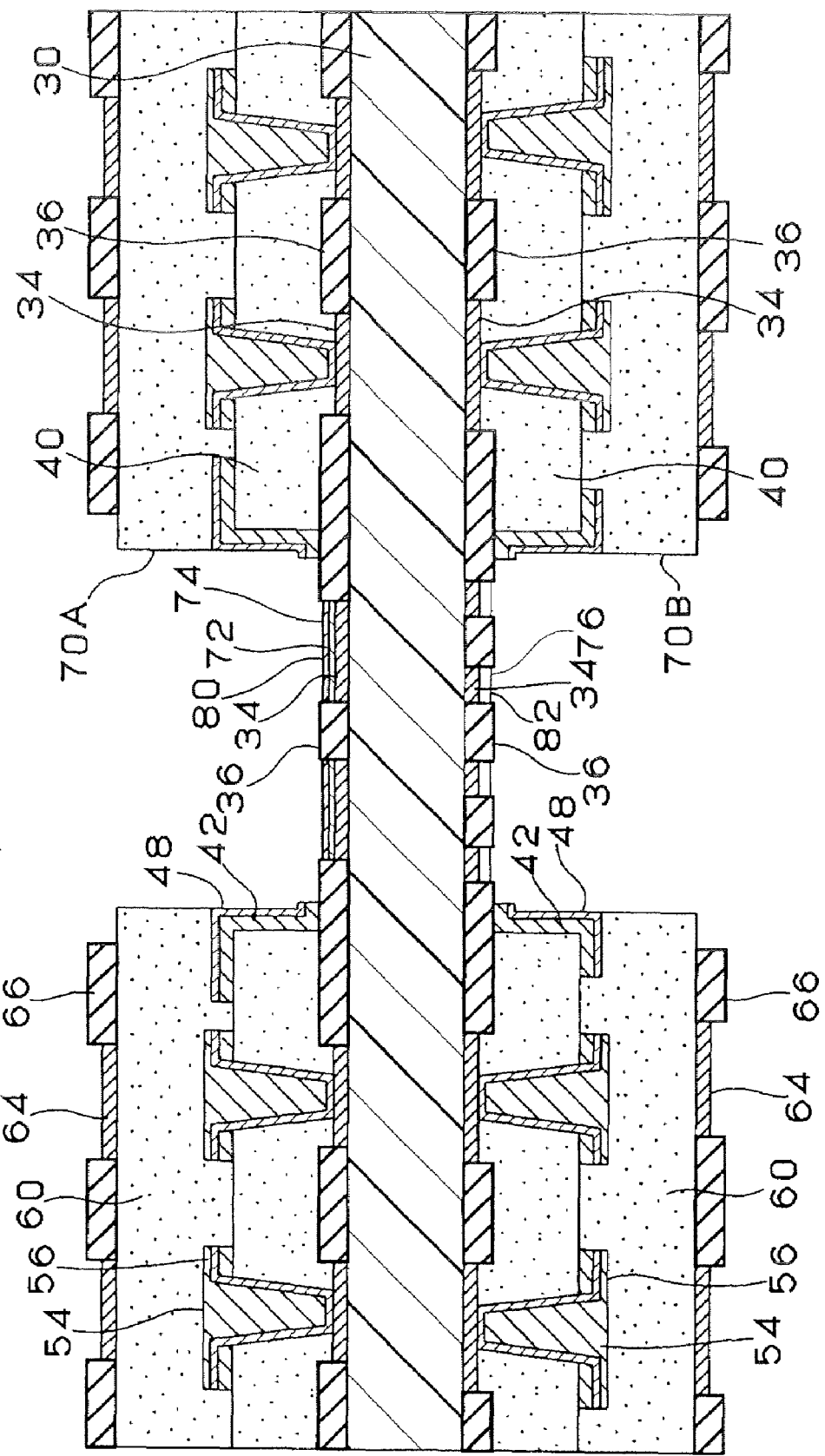
FIG. 7 is a cross-sectional view of the electronic parts substrate according to the first embodiment.
Figure 8:
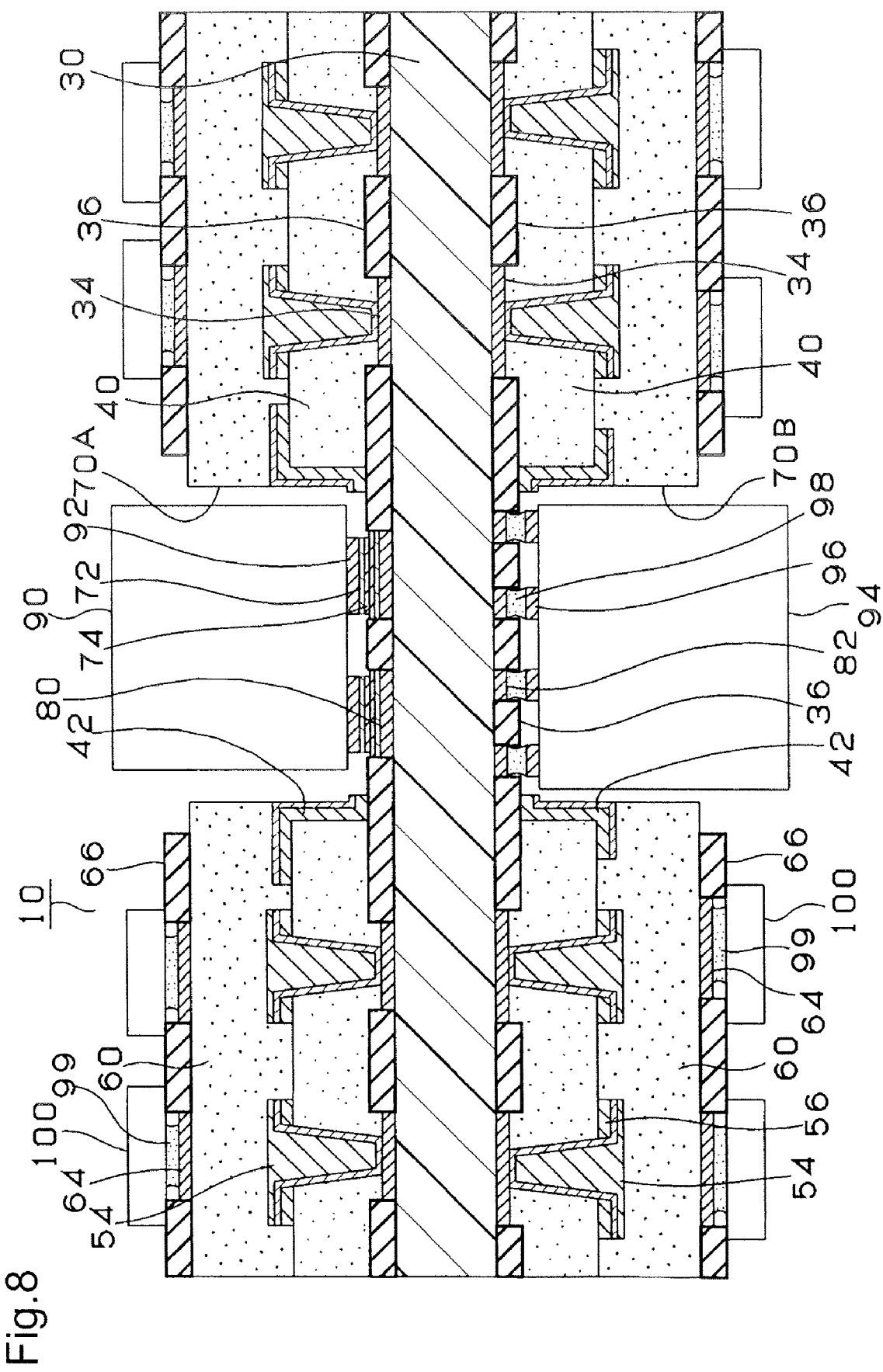
FIG. 8 is a cross-sectional view showing electronic parts mounted on the electronic parts substrate shown in FIG. 7.
Figure 13:
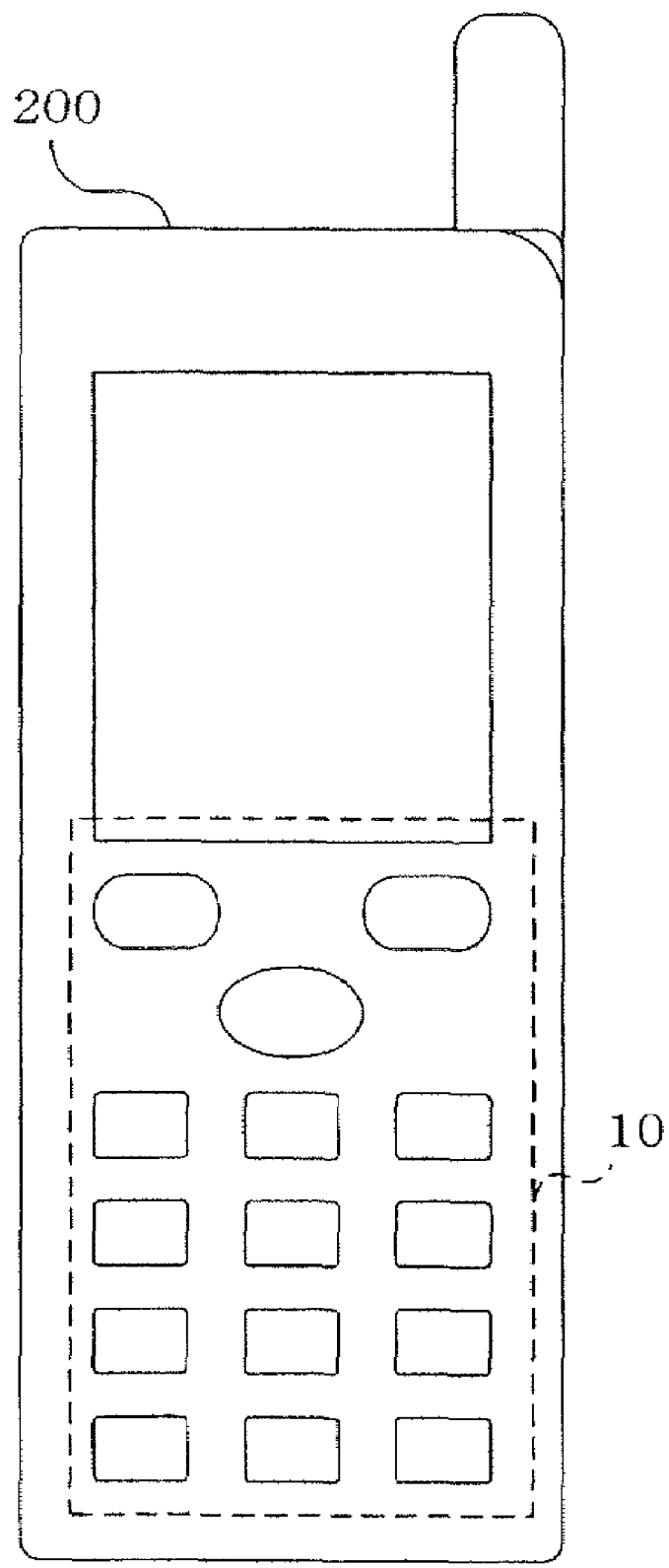
FIG. 13 is an explanatory diagram for a cellular phone utilizing an electronic parts substrate according to a first embodiment of the present invention.

An electronic parts substrate 10 according to the first embodiment of the present invention will be described below referring to FIGS. 1 to 8, 13. As shown in FIG. 13, the electronic parts substrate 10 according to the first embodiment is utilized in a portable electronic device, for example a cellular phone 200. FIG. 7 is a cross-sectional view of the electronic parts substrate 10 according to the first embodiment, and FIG. 8 is a cross-sectional view showing electronic parts mounted on the electronic parts substrate 10 shown in FIG. 7.

The electronic parts substrate 10 has a cavity 70A (an opening formed in insulating resin layers) on the top side and a cavity 70B (an opening formed in insulating resin layers) on the bottom side, and has a semiconductor chip 90 housed in the cavity 70A and a semiconductor chip 94 housed in the cavity 70B. Electronic parts 100 (active device like a semiconductor chip and a passive device like a resistor) are mounted on conductive circuits 64 via solders 99.

As shown in FIG. 7, a nickel plated film 72 and a gold plated film 74 are formed on a conductive circuit 34 in the cavity 70A on the top side, thereby forming a bump 80. As shown in FIG. 8, a terminal 92 of the semiconductor chip 90 to be housed in the cavity 70A likewise has a nickel plated film 72 and a gold plated film 74, and is directly connected to the bump 80 by a land-grid array.

As shown in FIG. 7, an OSP (Organic Solder-ability Preservative: Preflux) film 76 is coated on a conductive circuit 34 in the cavity 70B on the bottom side, thereby forming a terminal 82. As shown in FIG. 8, the semiconductor chip 94 is mounted on the terminal 82 by a solder ball 98 formed at a terminal 96 of the semiconductor chip 94 to be housed in the cavity 70B.

The electronic parts substrate 10 has the conductive circuits 34 and solder resist layers 36 formed on both sides (opposite upper and lower faces) of a center substrate 30 (a base substrate). A first resin layer 40 (an insulating resin layer) is formed on either side of the center substrate 30, and a filled via 54 and a conductive circuit 56 are formed on the first resin layer 40. A second resin layer 60 (another insulating resin layer) is provided over the first resin layer 40. The conductive circuit 64 and a solder resist layer 66 are provided above the second resin layer 60. The top and bottom of the second resin layer 60 are connected using a filled via (not shown) or a through hole bored through the electronic parts substrate 10.

The electronic parts substrate 10 according to the first embodiment has the cavities 70A, 70B formed in the top surface and the bottom surface back to back. Therefore, mounting tall semiconductor chips 90, 94 in the cavities 70A, 70B can suppress the height of the electronic parts substrate 10 with electronic parts mounted thereon. As the cavity 70A in the top surface and the cavity 70B in the bottom surface are formed symmetrically, the stress produced in the cavity 70A on the top side and the stress produced in the cavity 70B on the bottom side at the time of heat contraction become identical. This makes it harder to cause cracks in the substrate 30, the first resin layer 40, and the second resin layer 60, so that disconnection is difficult to occur even through repeated heat contraction. Although the cavity 70A and the cavity 70B are formed symmetrically in the first embodiment, the cavity on the top side and the cavity on the bottom side, as long as arranged back to back, even if not symmetrical, reduces the difference between stress produced in the cavity on the top side and stress produced in the cavity on the bottom side at the time of heat contraction. This makes it harder to cause cracks in the insulating resin layer and heat-contraction originated disconnection.

Further, according to the electronic parts substrate 10 of the first embodiment, because of the presence of the filled vias 54 for interlayer connection, the filled vias 54 can suppress contraction of the first resin layer 40 which, unlike a ceramic layer, has a large thermal expansion coefficient. This makes it possible to evade heat-contraction oriented reduction in reliability.

According to the electronic parts substrate 10 of the first embodiment, the solder resist layer 36 is buried between the substrate 30 and the first resin layer 40. In a case where the substrate 30 or the first resin layer 40 is formed, for example, of a glass epoxy resin obtained by impregnation of a glass cross as a core with epoxy, the core can suppress heat contraction. When the solder resist layer 36 with higher flexibility than the glass epoxy resin is present between the layers, however, the solder resist layer 36 can absorb thermal stress, making it possible to evade heat-contraction oriented reduction in reliability.

According to the electronic parts substrate 10 of the first embodiment, nickel-gold plating is applied to the bump 80 in the cavity 70A in the top surface, and the OSP film 76 is formed on the terminal 82 in the cavity 70B in the bottom surface. Accordingly, the semiconductor chip 90 having the terminal 92 to be connected to the nickel-gold plated bump 80 can be housed in the cavity 70A in the top surface, and the semiconductor chip 94 having the solder ball 98 compatible with the OSP film 76 can be housed in the cavity 70B in the bottom surface.

In the electronic parts substrate 10 of the first embodiment, a copper foil 42 is coated to a part of the side wall of the cavity 70A, 70B (corresponding portion of the first resin layer 40). This can shield the semiconductor chips 90, 94 to be housed in the respective cavities 70A, 70B, thus making it possible to suppress influence of electromagnetic waves or the like generated from the semiconductor chips 90, 94. While the copper foil is provided on the side wall, a plated film can be formed on the side wall of the cavity.

Figure 12:
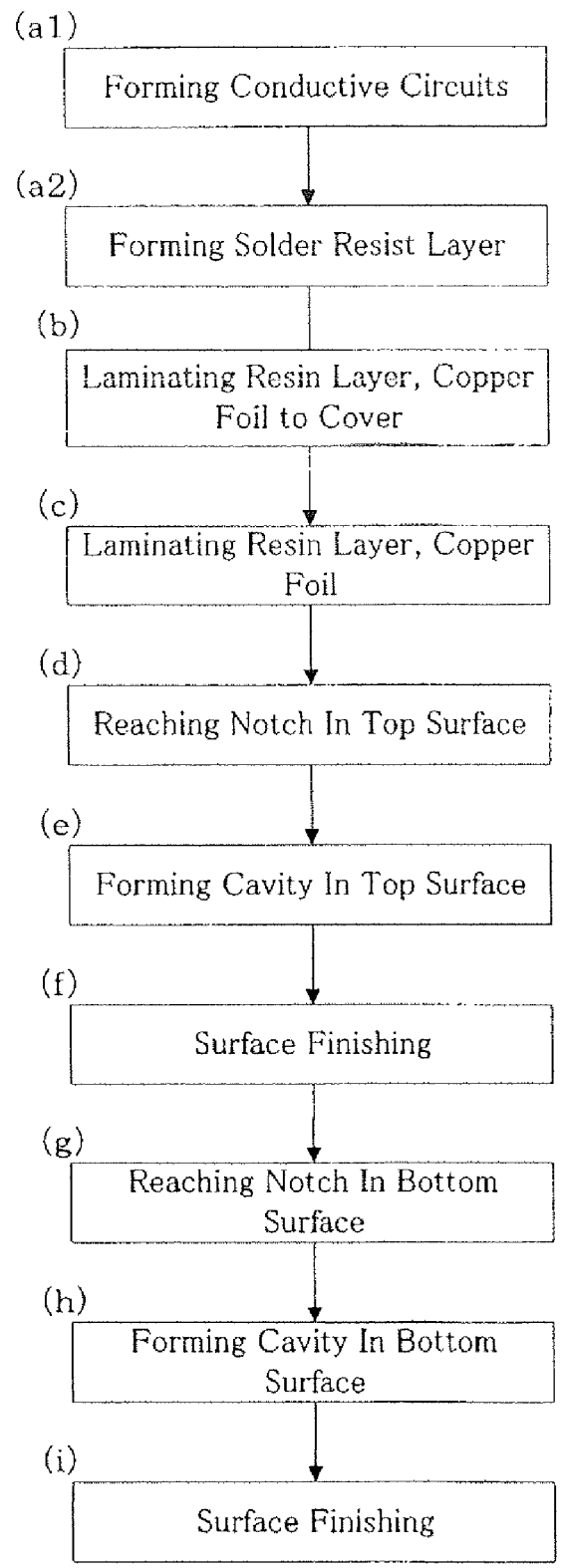
FIG. 12 is an flow diagram for a fabrication steps for an electronic parts substrate according to a first embodiment of the present invention.

A fabrication method for the electronic parts substrate according to the first embodiment will be described referring to FIGS. 1 to 6 showing explanatory diagrams and FIG. 12 showing flow diagram.

The method of fabricating an electronic parts substrate according to an embodiment of the present invention has the following steps: (a) forming a conductive circuit and a solder resist layer on a substrate; (b) laminating a first resin layer having an opening on each of a top surface and a bottom surface of the substrate, and a first copper foil on the first resin layer, and causing the first copper foil closely adhered to an interior of the opening; (c) laminating a second resin layer on the first copper foil and a second copper foil on the second resin layer; (d) forming notches in the second resin layer on the top surface or the bottom surface inward of the opening of the first resin layer by a laser in such a way as to reach the first copper foil; (e) forming a cavity on the top surface or the bottom surface by cutting the first copper foil along the formed notches and separating the notched second resin layer; (f) performing a first surface treatment on the conductive circuit on the substrate exposed by the cavity on the top surface or the bottom surface; (g) forming notches in the second resin layer on the other surface of the top surface or the bottom surface where the cavity is formed, inward of the opening of the first resin layer by the laser in such a way as to reach the first copper foil; (h) forming the cavity on the other surface of the top surface or the bottom surface, by cutting the first copper foil along the formed notches and separating the notched second resin layer; and (i) performing a second surface treatment on the conductive circuit on the substrate exposed by the cavity on the other surface of the top surface or the bottom surface.

(1) A copper clad laminate 30A having copper foils 32 of 5 to 250 μm in thickness laminated on both sides of an insulating substrate 30 of a glass epoxy resin or a BT (Bismaleimide-Triazine) resin of 0.2 to 0.8 mm in thickness is used as a starting material (FIG. 1A). The copper foils 32 are subjected to etching treatment to form conductive circuits 34 (FIG. 1B: (a1) step in FIG. 12).

(2) Next, a commercially available solder resist composition formed essentially of a thermoset resin or photosensitive resin is applied to both sides of the substrate 30, and the resultant structure is dried, after which with a photomask having solder resist openings patterned thereon being adhered to the solder resist layer, the structure is exposed with ultraviolet rays and developed to form openings. Then, the structure is cured by a heat treatment to form a solder resist layer 36 having a thickness of 15 to 25 μm ((FIG. 1C): (a2) step in FIG. 12).

Figure 2A:
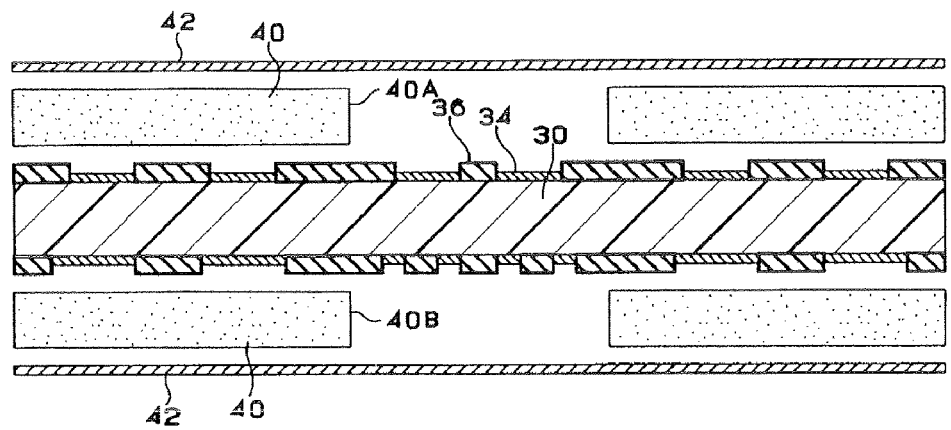
FIGS. 2A to 2C are explanatory diagrams for the fabrication process for the electronic parts substrate according to the first embodiment.
Figure 2B:
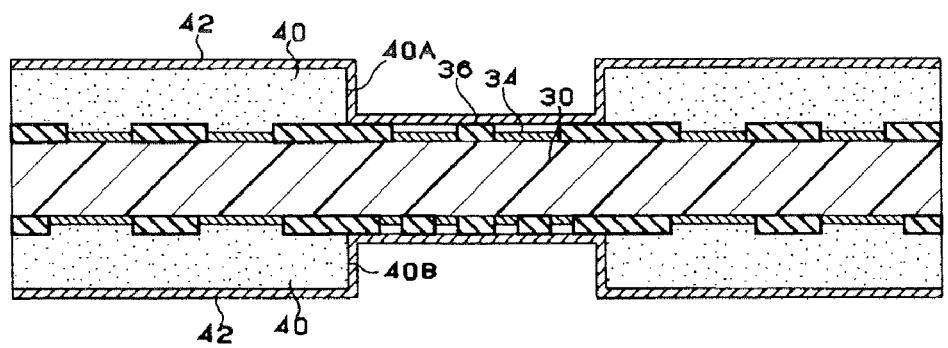

(3) A prepreg (first resin layer) 40 having an epoxy resin impregnated in a glass cross to be a B stage and a first copper foil 42 having a thickness of 5 to 250 μm are laminated (FIG. 2A and FIG. 2B: (b) step in FIG. 12). Openings 40A, 40B corresponding to the cavities 70A, 70B explained above referring to FIG. 7 are formed in the prepreg 40 in advance. The first copper foil 42 is laminated along the openings 40A, 40B in such a way as to cover the top surface of the substrate 30 under the openings 40A, 40B.

Figure 2C:
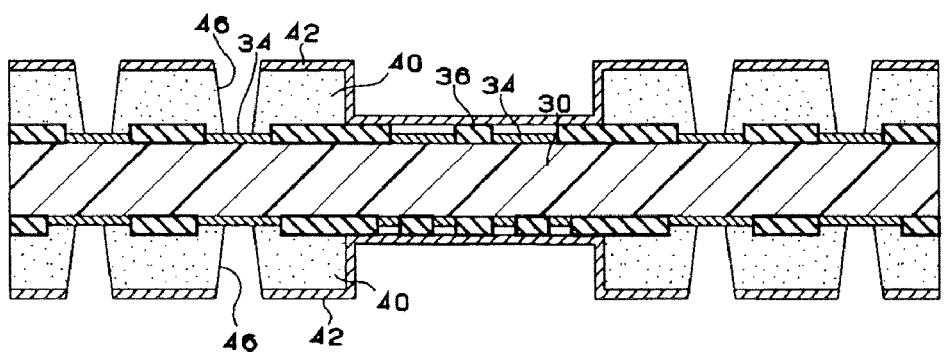

(4) An opening 46 reaching the conductive circuit 34 is formed in the first resin layer 40 by a laser (FIG. 2C).

Figure 3A:
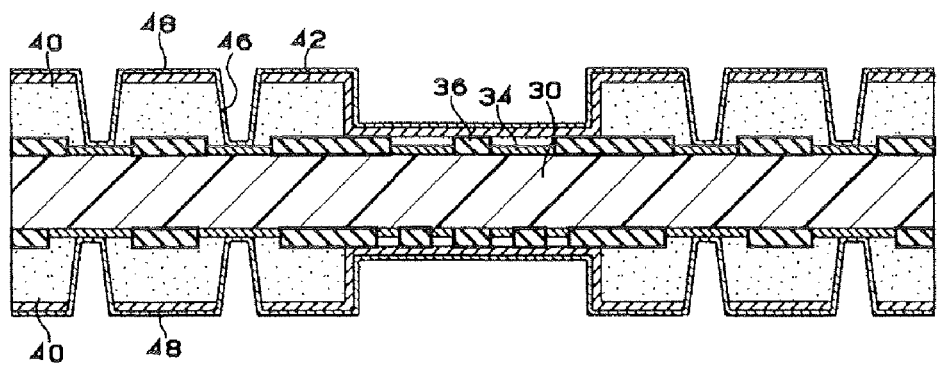
FIGS. 3A to 3D are explanatory diagrams for the fabrication process for the electronic parts substrate according to the first embodiment.

(5) A palladium catalyst is applied to the top surface of the first resin layer 40 having the opening 46 bored therein, and electroless copper plating is applied to the first resin layer 40, thereby forming an electroless copper plated film 48 (FIG. 3A).

Figure 3B:
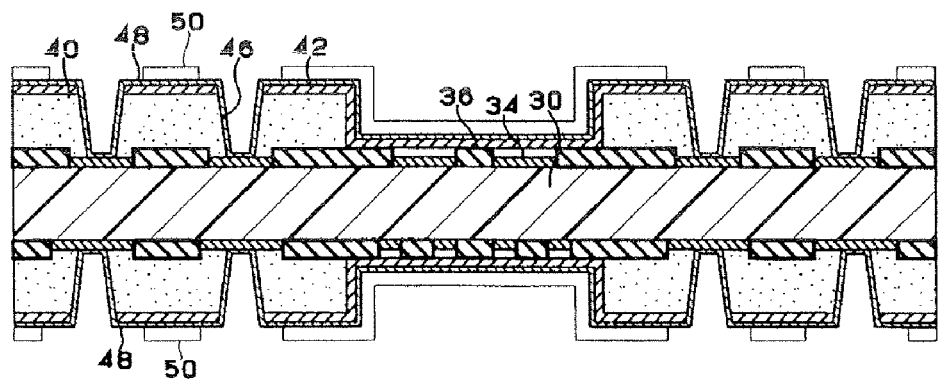

(6) A commercially available photosensitive dry film is adhered to the substrate on which the electroless copper plated film 48 is formed, and with a mask placed thereon, exposure and developing processes are performed, thereby providing a plated resist 50 (FIG. 3B).

Figure 3C:
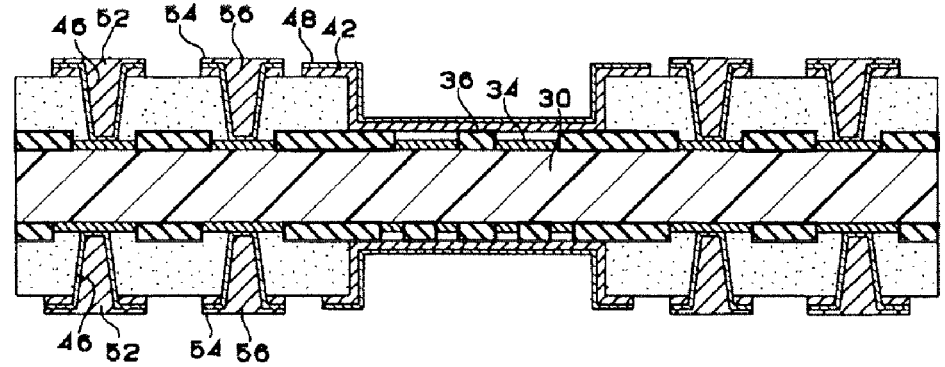

(7) Then, electroplating is performed on the substrate 30 to form an electroplated film 52. Then, the plated resist 50 is removed after which the underlying electroless copper plated film 48 is subjected to an etching process to be removed by being dissolved, forming an independent conductive circuit 56 and filled via 54 (FIG. 3C).

Figure 3D:
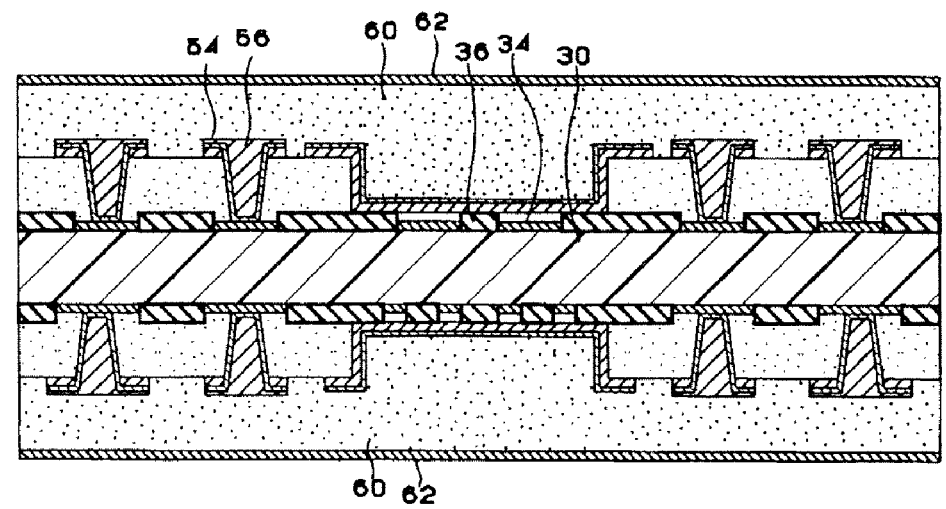

(8) Next, a prepreg (second resin layer) 60 having an epoxy resin impregnated in a glass cross to be a B stage and a second copper foil 62 having a thickness of 5 to 250 μm are laminated (FIG. 3D: (c) step in FIG. 12)

Figure 4A:
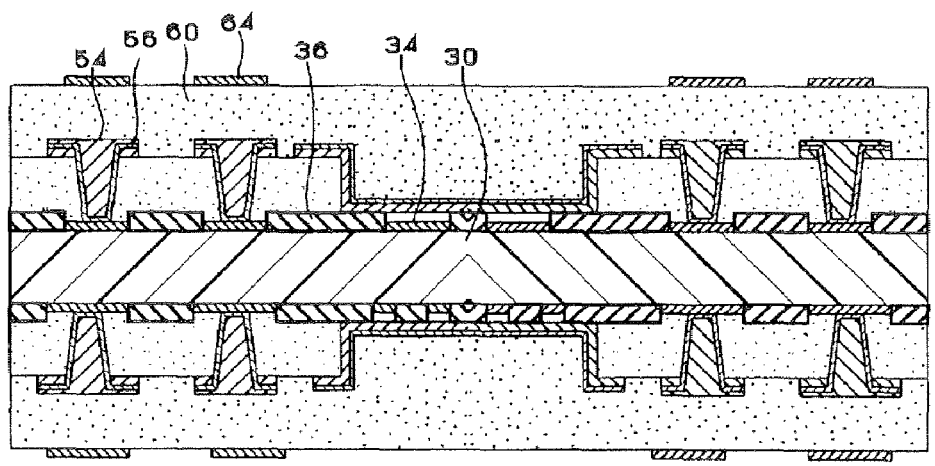
FIGS. 4A to 4C are explanatory diagrams for the fabrication process for the electronic parts substrate according to the first embodiment.
Figure 4B:
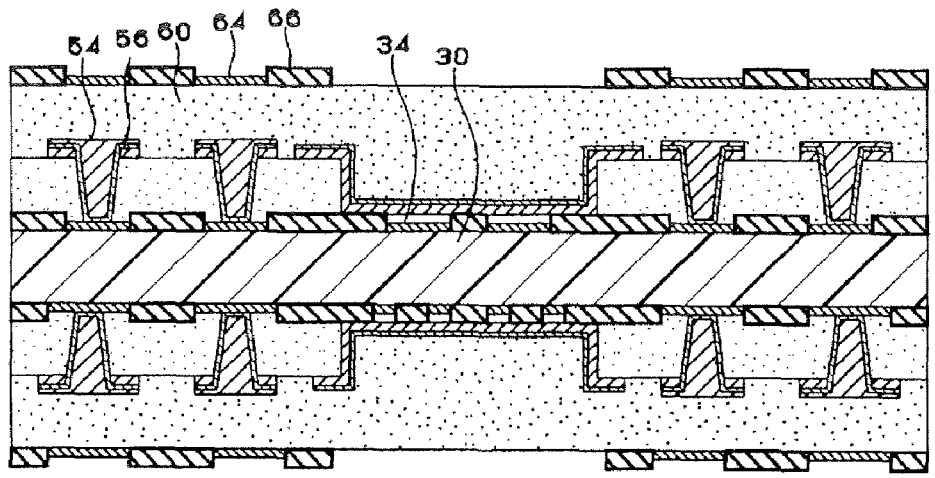

(9) The second copper foil 62 is subjected to an etching process to form a conductive circuit 64 (FIG. 4A), the same commercially available solder resist composition as used in the step (2) is applied thereto, thereby forming a solder resist layer 66 having a thickness of 15 to 25 μm (FIG. 4B).

Figure 4C:
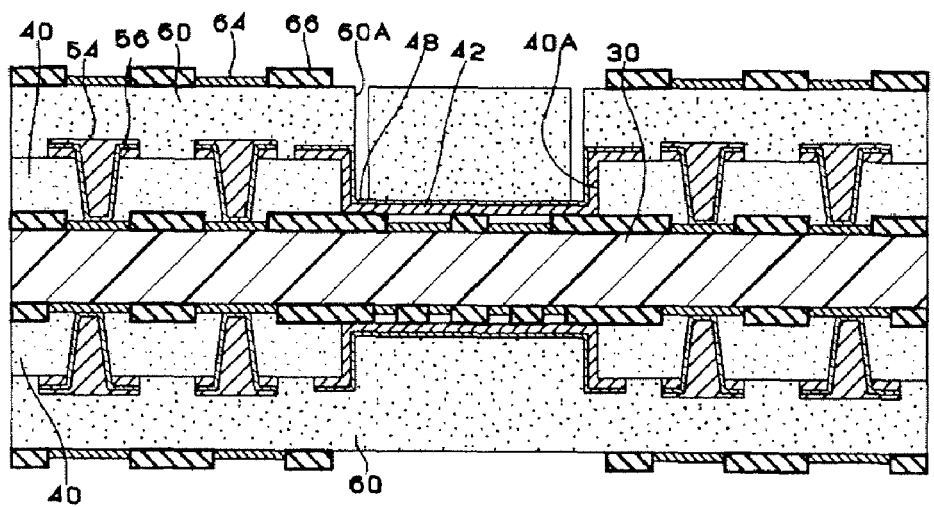

(10) A notch 60A reaching the first copper foil 42 inward of the opening 40A of the first resin layer 40 is formed in the second resin layer 60 on the top side by the laser (FIG. 4C: (d) step in FIG. 12).

Figure 5A:
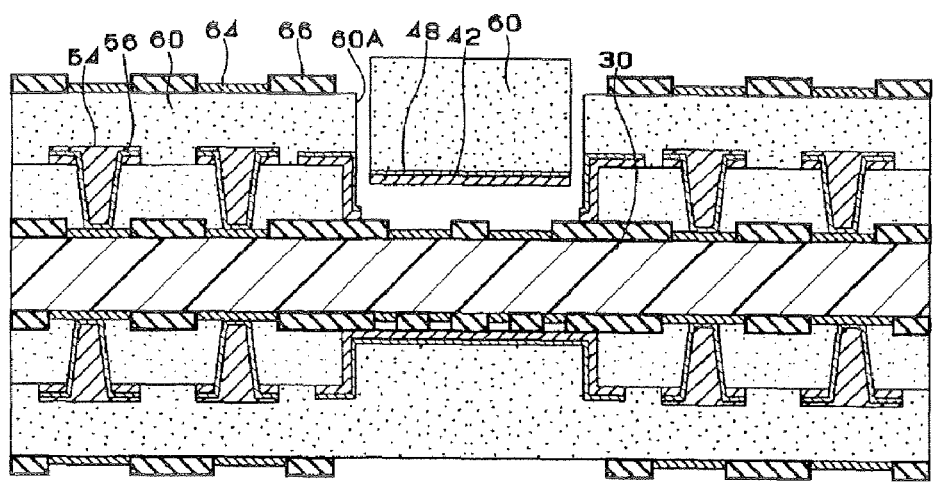
FIGS. 5A to 5C are explanatory diagrams for the fabrication process for the electronic parts substrate according to the first embodiment.
Figure 5B:
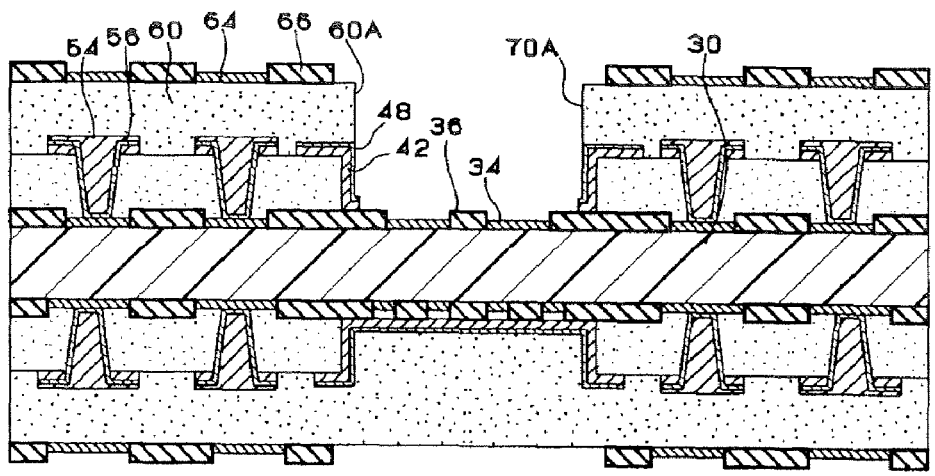
Figure 5C:
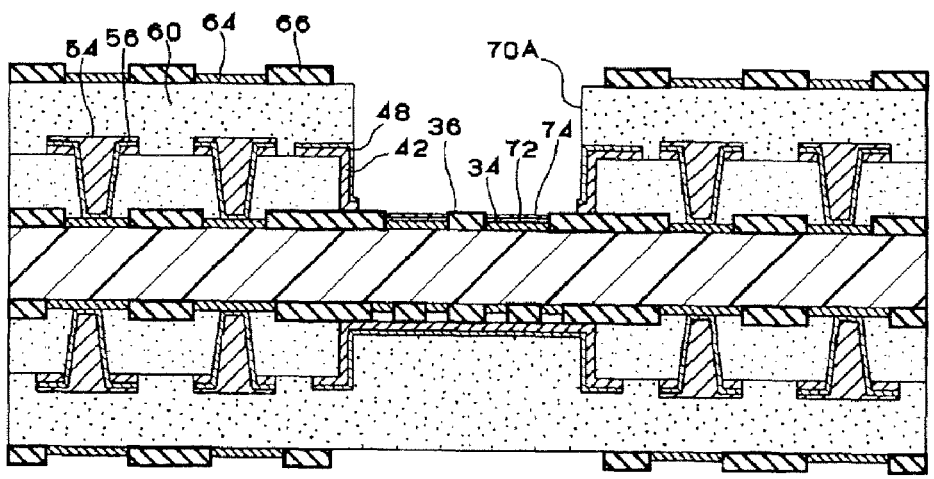

(11) The first copper foil 42 is cut along the formed notch 60A to separate the second resin layer 60 having the notch 60A, thereby forming a cavity 70A in the top surface (FIG. 5A, FIG. 5B: (e) step in FIG. 12).

(12) The substrate having the cavity 70A formed therein is dipped in an electroless nickel plating solution to form a nickel plated film 72 having a thickness of 5 μm on the conductive circuit 34. Further, the substrate is dipped in an electroless gold plating solution to form a gold plated film 74 having a thickness of 0.03 μm on the nickel plated film 72 (FIG. 5C: (f) step in FIG. 12). In place of the nickel-gold layer, a single layer of tin or noble metal (gold, silver, palladium, platinum or the like) may be formed.

Figure 6A:
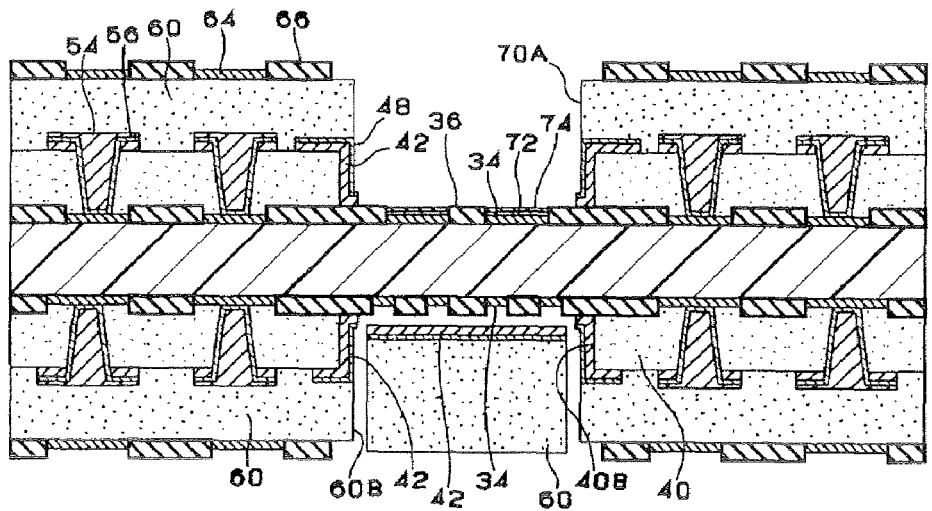
FIGS. 6A to 6C are explanatory diagrams for the fabrication process for the electronic parts substrate according to the first embodiment.
Figure 6B:
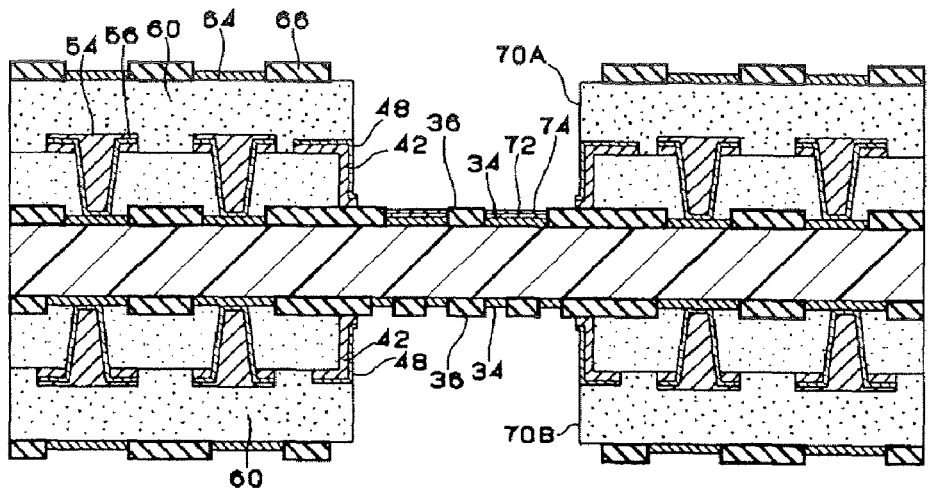

(13) A notch 60B reaching the first copper foil 42 inward of the opening 40B of the first resin layer 40 is formed in the second resin layer 60 on the bottom side by the laser (FIG. 6A: (g) step in FIG. 12). Then, the first copper foil 42 is cut along the formed notch 60B to separate the second resin layer 60 having the notch 60B, thereby forming a cavity 70B in the bottom surface (FIG. 6B: (h) step in FIG. 12).

Figure 6C:
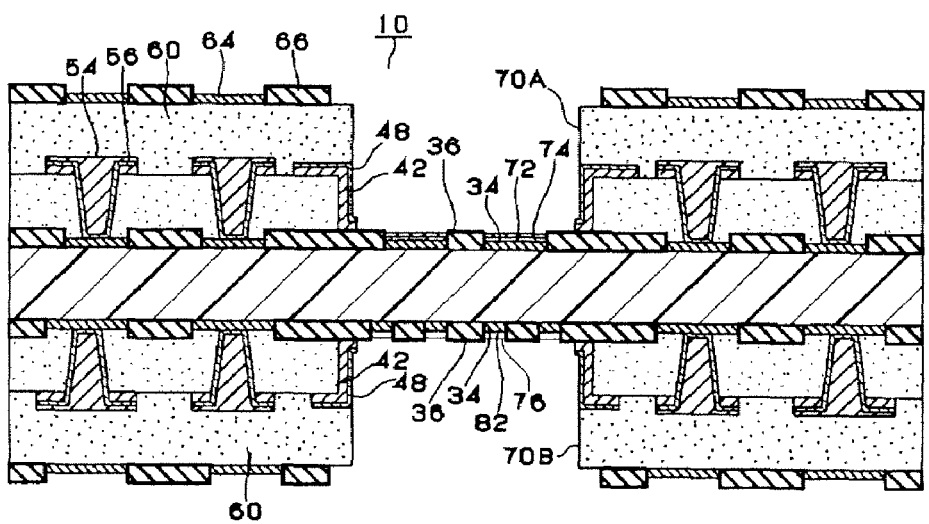

(14) An OSP film 76 is coated on the conductive circuit 34 in the cavity 70B in the bottom surface to form an terminal 82, thereby completing the electronic parts substrate 10 (FIG. 6C: (i) step in FIG. 12).

As shown in FIG. 8, the semiconductor chip 90 is mounted in the cavity 70A in the top surface by directly connecting the terminal 92 to the bump 80 by a land-grid array. The semiconductor chip 94 is mounted on the terminal 82 in the cavity 70B in the bottom surface by the solder ball 98. Likewise, an electronic part 100 is mounted on the conductive circuit 64 of the electronic parts substrate 10 via the solder 99.

Second Embodiment

Figure 9:
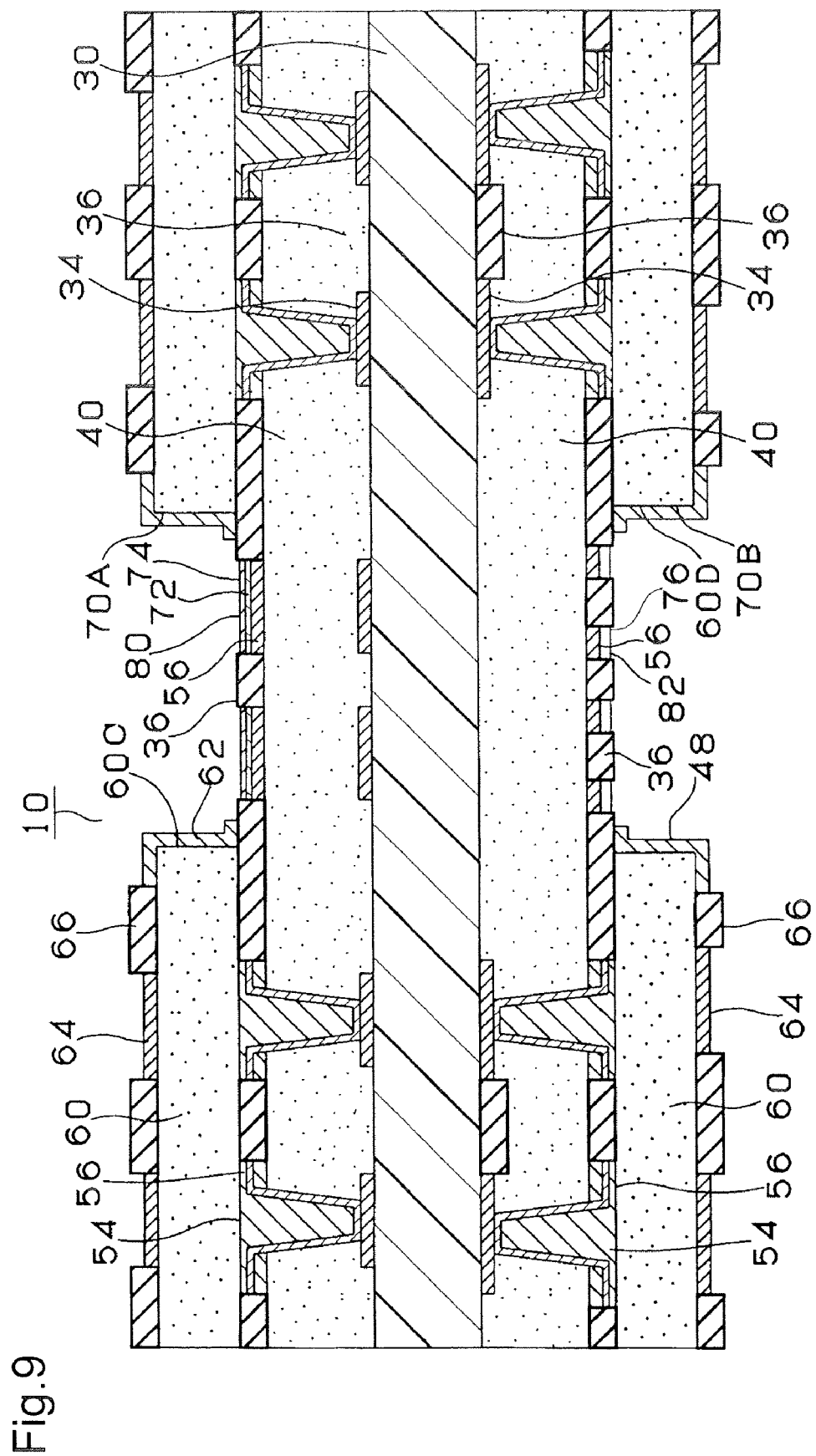
FIG. 9 is a cross-sectional view of an electronic parts substrate according to a second embodiment of the present invention.

FIG. 9 shows a cross-sectional view of an electronic parts substrate 10 according to the second embodiment.

In the first embodiment described above referring to FIG. 7, the cavities 70A, 70B reaching the substrate 30 are formed. According to the second embodiment, by way of comparison, cavities 70A, 70B reaching the first resin layer 40 are formed. Even in the electronic parts substrate of the second embodiment, the second copper foil 62 is left on the side wall of the cavity 70A, 70B along an opening 60C, 60D of the second resin layer 60.

Although the exemplified electronic parts substrates of the first and second embodiments each have the lamination of the first resin layer 40 and the second resin layer 60, it is possible to fabricate an electronic parts substrate having cavities by further laminating a third resin layer or more.

Third Embodiment

The third embodiment of the present invention will be described below referring to FIGS. 10 and 11.

Figure 10:
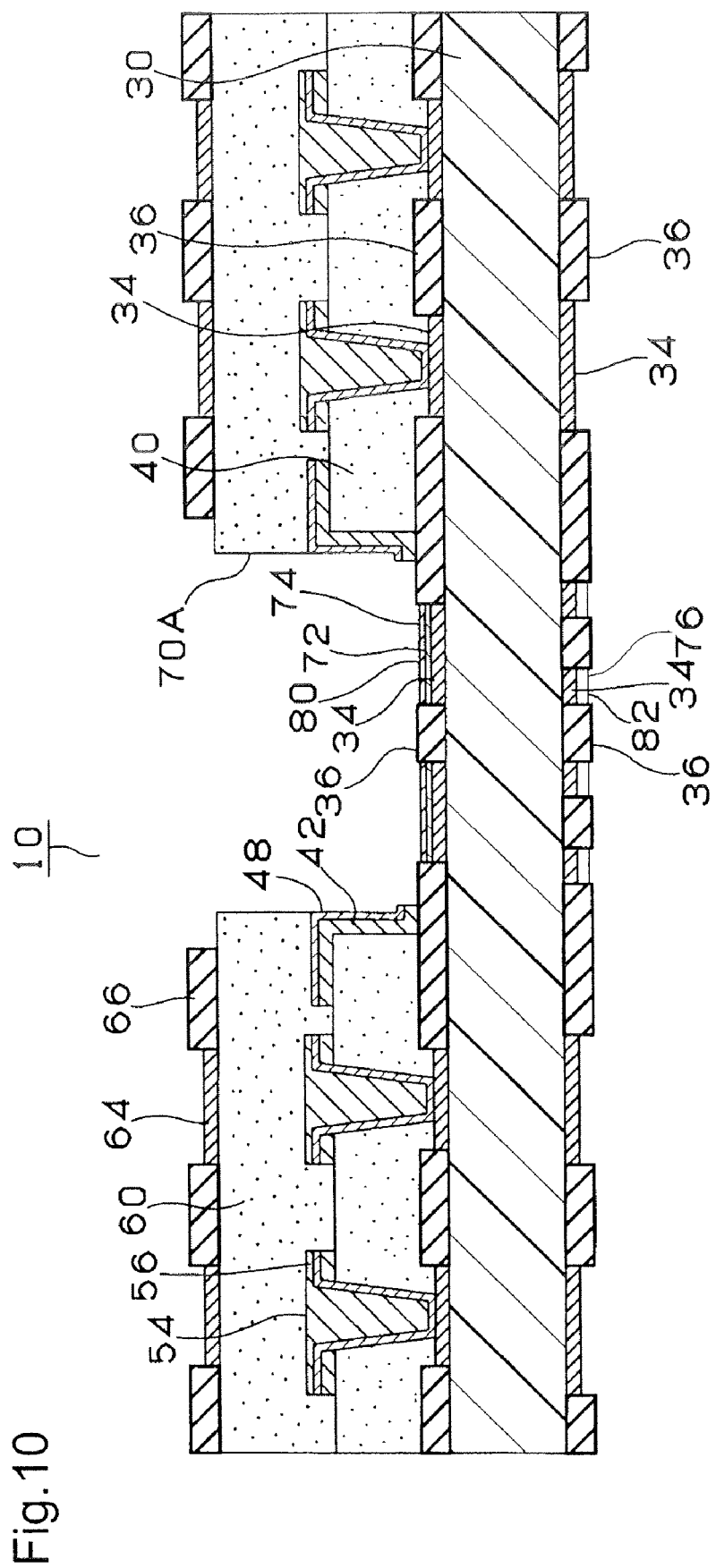
FIG. 10 is a cross-sectional view of an electronic parts substrate according to a third embodiment.
Figure 11:
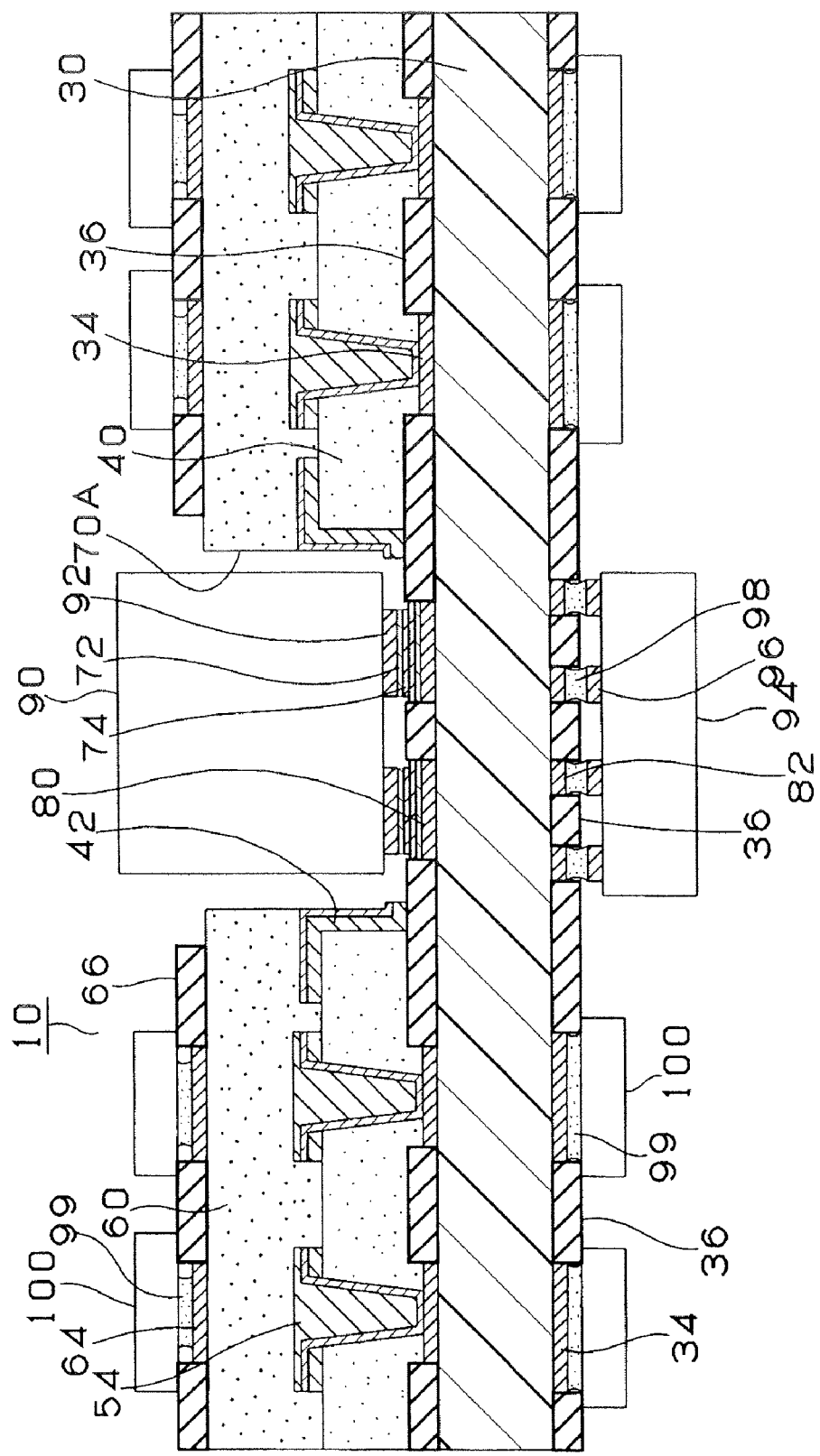
FIG. 11 is a cross-sectional view showing electronic parts mounted on the electronic parts substrate shown in FIG. 10.

FIG. 10 is a cross-sectional view of an electronic parts substrate 10 according to the third embodiment, and FIG. 11 is a cross-sectional view showing electronic parts mounted on the electronic parts substrate 10 shown in FIG. 10.

In the first and second embodiments, cavities are provided on both sides of the substrate 30. In the third embodiment, however, a cavity 70A is provided only on the top side of the substrate 30.

Because the electronic parts substrate 10 according to the third embodiment has the cavity 70A, mounting the tall semiconductor chip 90 in the cavity 70A can suppress the height of the electronic parts substrate having electronic parts mounted thereon. Further, because the electronic parts substrate 10 of the third embodiment has the filled via 54 for interlayer connection, the filled via 54 can suppress contraction of the first resin layer 40 which, unlike a ceramic layer, has a large thermal expansion coefficient, thus making it possible to evade heat-contraction originated reduction in reliability.

An electronic parts substrate which has cavities formed therein according to the embodiment of the present invention, mounting tall electronic parts in the cavities can suppress the height of the electronic parts substrate having electronic parts mounted thereon. Further, filled vias for interlayer connection can suppress contraction of the insulating resin layer which, unlike a ceramic layer, has a large thermal expansion coefficient, thus making it possible to evade heat-contraction originated reduction in reliability.

An electronic parts substrate according to the embodiment of the present invention may have a portion where cavities are formed in the top surface and the bottom surface back to back. Therefore, mounting tall electronic parts in the cavities can suppress the height of the electronic parts substrate with electronic parts mounted thereon. Because of the presence of the portion where the cavities are arranged back to back, the difference between stress produced in the cavity on the top side and stress produced in the cavity on the bottom side at the time of heat contraction becomes smaller. This makes it harder to cause cracks in the insulating resin layer and heat-contraction originated disconnection. Further, the presence of filled vias for interlayer connection can suppress contraction of the insulating resin layer which, unlike a ceramic layer, has a large thermal expansion coefficient, thus making it possible to evade heat-contraction oriented reduction in reliability.

An electronic parts substrate according to the embodiment of the present invention may have a cavity in the top surface and a cavity in the bottom surface both formed symmetrically. Therefore, the stress produced in the cavity on the top side and the stress produced in the cavity on the bottom side at the time of heat contraction become identical. This makes it harder to cause cracks in the insulating resin layer, so that disconnection is difficult to occur even through repeated heat contraction.

An electronic parts substrate according to the embodiment of the present invention may have a solder resist layer buried between layers. In a case where the insulating resin layer is formed, for example, of a glass epoxy resin obtained by impregnation of a glass cross as a core with epoxy, the core can suppress heat contraction. When the solder resist layer with higher flexibility than the glass epoxy resin is present between the layers, however, the solder resist layer can absorb thermal stress, making it possible to evade heat-contraction oriented reduction in reliability.

In an electronic parts substrate according to the embodiment of the present invention, a terminal in a cavity in the top surface and a terminal in a cavity in the bottom surface may be subjected to different surface treatments. Therefore, electronic parts having terminals which require different surface treatments can be disposed in the cavity in the top surface and the cavity in the bottom surface, respectively.

An electronic parts substrate according to the embodiment of the present invention may have a copper foil or copper plating applied to the side wall of each cavity to shield an electronic part to be housed in the cavity. It is therefore possible to suppress the influence of electromagnetic waves generated from the electronic part.

In a fabrication method for an electronic parts substrate according to the embodiment of the present invention, a solder resist layer formed on a substrate is buried in a first resin layer. In a case where, for example, the substrate or the first resin layer is formed of a glass epoxy resin obtained by impregnation of a glass cross as a core with epoxy, therefore, the core can suppress heat contraction. When the solder resist layer with higher flexibility than the glass epoxy resin is present between the layers, however, the solder resist layer can absorb thermal stress, making it possible to evade heat-contraction oriented reduction in reliability.

Further, in an electronic parts substrate according to the embodiment of the present invention, a cavity is formed in the top surface or the bottom surface, and a terminal in the cavity is subjected to a first surface treatment, after which a cavity is formed in the other surface, and a terminal in the cavity in the other surface is subjected to a second surface treatment. Therefore, electronic parts having terminals which require different surface treatments can be disposed in the cavity in the top surface and the cavity in the bottom surface, respectively.

In the fabrication method for an electronic parts substrate according to the embodiment of the present invention, a first copper foil is adhered to the interior of an opening in the first resin layer which constitutes the side wall of a cavity, and the copper foil on the side wall of the opening is left at the time of separating a second resin layer. Leaving the copper foil on the side wall of the cavity can shield an electronic part housed in the cavity, thus making it possible to suppress influence of electromagnetic waves or the like generated from the electronic part.

A portable electronic device mounting the above mentioned electronic parts substrate according to the embodiment of the present invention has an improved performance and mounting density of the electronic parts which can realize a miniaturized thin thereof.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic parts substrate comprising:
   a base substrate;
   a plurality of insulating resin layers provided on the base substrate;
   at least one conductive circuit sandwiched between the plurality of insulating resin layers and/or between the base substrate and the plurality of insulating resin layers;
   at least one opening formed in at least one of the plurality of insulating resin layers; and
   at least one filled via provided in the plurality of insulating resin layers,
   wherein the base substrate has opposite upper and lower faces, the plurality of insulating resin layers being provided on both of the upper and lower faces,
   wherein the at least one opening has an upper opening and a lower opening which are provided at opposite positions with respect to the base substrate, and
   wherein an upper terminal is provided in the upper opening and a lower terminal is provided in the lower opening, the upper opening and the lower opening being subjected to different surface treatments.

2. A method for manufacturing an electronic parts substrate, the method comprising:
   providing a base substrate having opposite upper and lower faces;

providing an upper conductive circuit and an upper solder resist layer on the upper face of the base substrate;

providing a lower conductive circuit and a lower solder resist layer on the lower face of the base substrate;

providing a first upper resin layer on the upper conductive circuit and the upper solder resist layer, the first upper resin layer having a preformed opening;

providing a first lower resin layer on the lower conductive circuit and the lower solder resist layer, the first lower resin layer having a preformed opening;

providing a first upper copper foil on the first upper resin layer to adhere to an inner surface of the preformed opening of the first upper resin layer;

providing a first lower copper foil on the first lower resin layer to adhere to an inner surface of the preformed opening of the first lower resin layer;

providing a second upper resin layer on the first upper copper foil;

providing a second lower resin layer on the first lower copper foil;

providing a second upper copper foil on the second upper resin layer;

providing a second lower copper foil on the second lower resin layer;

cutting the second upper resin layer and the first upper copper foil along a periphery of the preformed opening using a laser;

cutting the second lower resin layer and the first lower copper foil along a periphery of the preformed opening using a laser;

removing the cut second upper resin layer and the first upper copper foil to form an upper opening in which the upper conductive circuit is exposed;

removing the cut second lower resin layer and the first lower copper foil to form a lower opening in which the lower conductive circuit is exposed;

performing a first surface treatment on the exposed upper conductive circuit; and performing a second surface treatment on the exposed lower conductive circuit.

\* \* \* \* \*